(12) United States Patent
Kuo et al.

(10) Patent No.: US 9,326,402 B2
(45) Date of Patent: Apr. 26, 2016

(54) DOOR STRUCTURE WITH EASY ASSEMBLY AND ELECTRONIC DEVICE THEREWITH

(71) Applicant: Wistron Corporation, New Taipei (TW)

(72) Inventors: Yu-Ling Kuo, New Taipei (TW); Chun Chang, New Taipei (TW); Kai-Hsiang Chang, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 220 days.

(21) Appl. No.: 14/011,738

(22) Filed: Aug. 27, 2013

(65) Prior Publication Data

US 2014/0139981 A1 May 22, 2014

(30) Foreign Application Priority Data

Nov. 19, 2012 (TW) .............................. 101143094 A

(51) Int. Cl.
*H05K 5/02* (2006.01)
*G06F 1/16* (2006.01)

(52) U.S. Cl.
CPC ............ *H05K 5/0239* (2013.01); *G06F 1/1656* (2013.01)

(58) Field of Classification Search
CPC ..... H05K 5/0239; H05K 5/03; H01R 13/447; H01R 13/5213; H02G 3/14
See application file for complete search history.

(56) References Cited

U.S. PATENT DOCUMENTS

| 7,597,568 B1 * | 10/2009 | Lu ........................ H05K 5/0239 439/137 |
| 2009/0032279 A1 * | 2/2009 | Gong ................... H05K 5/0239 174/67 |

(Continued)

FOREIGN PATENT DOCUMENTS

| CN | 101086660 | 12/2007 |
| CN | 102026507 A | 4/2011 |

(Continued)

OTHER PUBLICATIONS

Office action mailed on Sep. 24, 2014 for the Taiwan application No. 101143094, filing date: Nov. 19, 2012, p. 1 line 1-11, p. 3 line 2-26 and p. 4-8.

(Continued)

*Primary Examiner* — Hoa C Nguyen
*Assistant Examiner* — Keith Depew
(74) *Attorney, Agent, or Firm* — Winston Hsu; Scott Margo

(57) ABSTRACT

A door structure includes a rotary cover, a pivotal portion and a shielding component. The rotary cover is connected to a housing in a rotatable manner. The rotary cover covers a slot on the housing as rotating to a closed position. The pivotal portion is connected to the rotary cover and passes through a pivoting hole on the housing to be pivoted on the housing so that the rotary cover is capable of rotating relative to the housing. The shielding component is installed on the pivotal portion and disposed inside the housing. The shielding component is for shielding at least one part of the pivoting hole on the housing when the rotary cover rotates to an open position to expose the slot on the housing and the shielding component pivots to a position corresponding to or nearby the pivoting hole with the pivotal portion.

20 Claims, 12 Drawing Sheets

(56) References Cited

U.S. PATENT DOCUMENTS

| | | | | |
|---|---|---|---|---|
| 2010/0240239 A1* | 9/2010 | Chen | ................. | G06F 1/1616 439/142 |
| 2011/0116216 A1* | 5/2011 | Weng | ................. | H05K 5/0239 361/679.01 |
| 2011/0116240 A1* | 5/2011 | Wang | ................. | H05K 5/03 361/728 |
| 2012/0155051 A1* | 6/2012 | Cheng | ................. | G06F 1/1656 361/807 |
| 2012/0298536 A1* | 11/2012 | Rauta | ................. | H04B 1/3888 206/301 |
| 2013/0021725 A1* | 1/2013 | Huang | ................. | G06F 1/1656 361/679.01 |
| 2013/0215557 A1* | 8/2013 | Ko | ................. | H04M 1/0274 361/679.01 |
| 2013/0222986 A1* | 8/2013 | Nakatsu | ................. | H04N 5/2251 361/679.01 |
| 2013/0293073 A1* | 11/2013 | Tsai | ................. | H05K 5/061 312/229 |
| 2014/0085784 A1* | 3/2014 | Lee | ................. | H05K 5/0221 361/679.01 |
| 2014/0113467 A1* | 4/2014 | Senatori | ................. | G06F 1/1633 439/142 |
| 2014/0331562 A1* | 11/2014 | Shinmura | ................. | H04M 1/18 49/463 |

FOREIGN PATENT DOCUMENTS

| | | |
|---|---|---|
| TW | 200802469 | 1/2008 |
| TW | 201112923 | 4/2011 |
| TW | 201228523 | 7/2012 |

OTHER PUBLICATIONS

Office action mailed on Jan. 14, 2016 for the China application No. 201210529838.0, p. 3-8.

* cited by examiner

DOOR STRUCTURE WITH EASY ASSEMBLY AND ELECTRONIC DEVICE THEREWITH

BACKGROUND OF THE INVENTION

1. Field of the Invention

The present invention relates to a door structure with easy assembly and an electronic device therewith, and more particularly, to a door structure capable of effectively shielding a pivoting hole on a housing as rotating to an opened position and an electronic device therewith.

2. Description of the Prior Art

With the development of information and computer technology, the size of a computer is becoming smaller and the computer is utilized in a wide variety of fields. In order to expand functions of a computer system for satisfying a user's various demands, various external devices of the computer system come with the trend. For example, an external hard disk drive and a portable storage device can expand the memory capacity of the computer system. An external optical disk drive and an optical disk writer can expand multimedia access function of the computer system. A network cable allows the computer system to be connected to an internet so as to gather information online or surf webpage. However, a rotary cover pivoting to the housing is often utilized to rotatably shield the connector for an aim of hiding the connector of the external expanding device. The pivot portion of the conventional rotary cover passes through into the housing. As the rotary cover is opened relative to the housing, dust and pollution are easy falling to the housing via the pivot hole that results in electromagnetic interference and discharge effect of static electricity.

SUMMARY OF THE INVENTION

The present invention provides a door structure capable of effectively shielding a pivoting hole on a housing as rotating to an opened position and an electronic device therewith for solving above drawbacks.

According to the claimed invention, a door structure includes a rotary cover, a pivotal portion and a shielding component. The rotary cover is connected to the housing in a rotatable manner. The rotary cover covers a slot on the housing as rotating to a closed position. The pivotal portion includes a first part, a second part and a third part. The first part is connected to the rotary cover. The second part pivots to a pivoting hole on a side of the slot on the housing, so that the rotary cover rotates relative to the housing. The third part is located inside or adjacent to the pivoting hole when the rotary cover rotates relative to the housing. The shielding component is disposed on the third part. The shielding component moves with the third part to the pivoting hole or to a position adjacent to the pivoting hole when the rotary cover rotates to an opened position to expose the slot on the housing, so as to at least partly shield the pivoting hole on the housing.

According to the claimed invention, dimensions of the shielding component are substantially greater than dimensions of the pivoting hole.

According to the claimed invention, the shielding component contacts against an inner side of the pivoting hole when the rotary cover rotates to the opened position.

According to the claimed invention, a part of the shielding component fits into the pivoting hole, and the other part of the shielding component contacts against the inner side of the pivoting hole when the rotary cover rotates to the opened position.

According to the claimed invention, dimensions of the shielding component are substantially equal to or smaller than dimensions of the pivoting hole.

According to the claimed invention, the shielding component fits into the pivoting hole when the rotary cover rotates to the opened position.

According to the claimed invention, the shielding component is located at outside of the pivoting hole and adjacent to the pivoting hole when the rotary cover rotates to the opened position.

According to the claimed invention, a sunken slot is formed on the shielding component. The third part of the pivotal portion is a hook, and the hook is engaged with the sunken slot so as to fix the shielding component on the pivotal portion.

According to the claimed invention, the shielding component is made of nonconductive material.

According to the claimed invention, the shielding component is made of rubber material.

According to the claimed invention, an electronic device includes a housing whereon a slot and a pivoting hole are formed, at least one connector installed on a side of the slot on the housing, and a door structure connected to the housing for shielding the at least one connector. The door structure includes a rotary cover, a pivotal portion and a shielding component. The rotary cover is connected to the housing in a rotatable manner. The rotary cover covers the at least one connector as rotating to a closed position. The pivotal portion includes a first part, a second part and a third part. The first part is connected to the rotary cover. The second part pivots to a pivoting hole on a side of the slot on the housing, so that the rotary cover rotates relative to the housing. The third part is located inside or adjacent to the pivoting hole when the rotary cover rotates relative to the housing. The shielding component is disposed on the third part. The shielding component moves with the third part to the pivoting hole or to a position adjacent to the pivoting hole when the rotary cover rotates to an opened position to expose the slot on the housing, so as to at least partly shield the pivoting hole on the housing.

The present invention provides the door structure capable of effectively shielding the pivoting hole on the housing as rotating to the opened position and the electronic device therewith. Because the pivotal portion connected to the rotary cover passes through the pivoting hole on the housing to directly pivot to the inner of the housing, the assembly and disassembly of the rotary cover is tooless and easy, so as to increase the assembly convenience and to decrease the assembly cost. Further, when the rotary cover is opened relative to the housing, the present invention utilizes the shielding component connected to the pivotal portion to completely shield the pivoting hole on the housing, to effectively prevent the dust from falling into the housing via the pivoting hole and to prevent effects of the electromagnetic interference and the electrostatic discharge.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the embodiments, reference is made to the accompanying drawings which form a part hereof, and in which is shown by way of illustration specific embodiments in which the invention may be practiced. In this regard, directional terminology, such as "top," "bottom," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," and "installed" and variations thereof herein are used broadly and encompass direct and indirect connections and installations. Accordingly, the drawings and descriptions will be regarded as illustrative in nature and not as restrictive.

Figure 1:
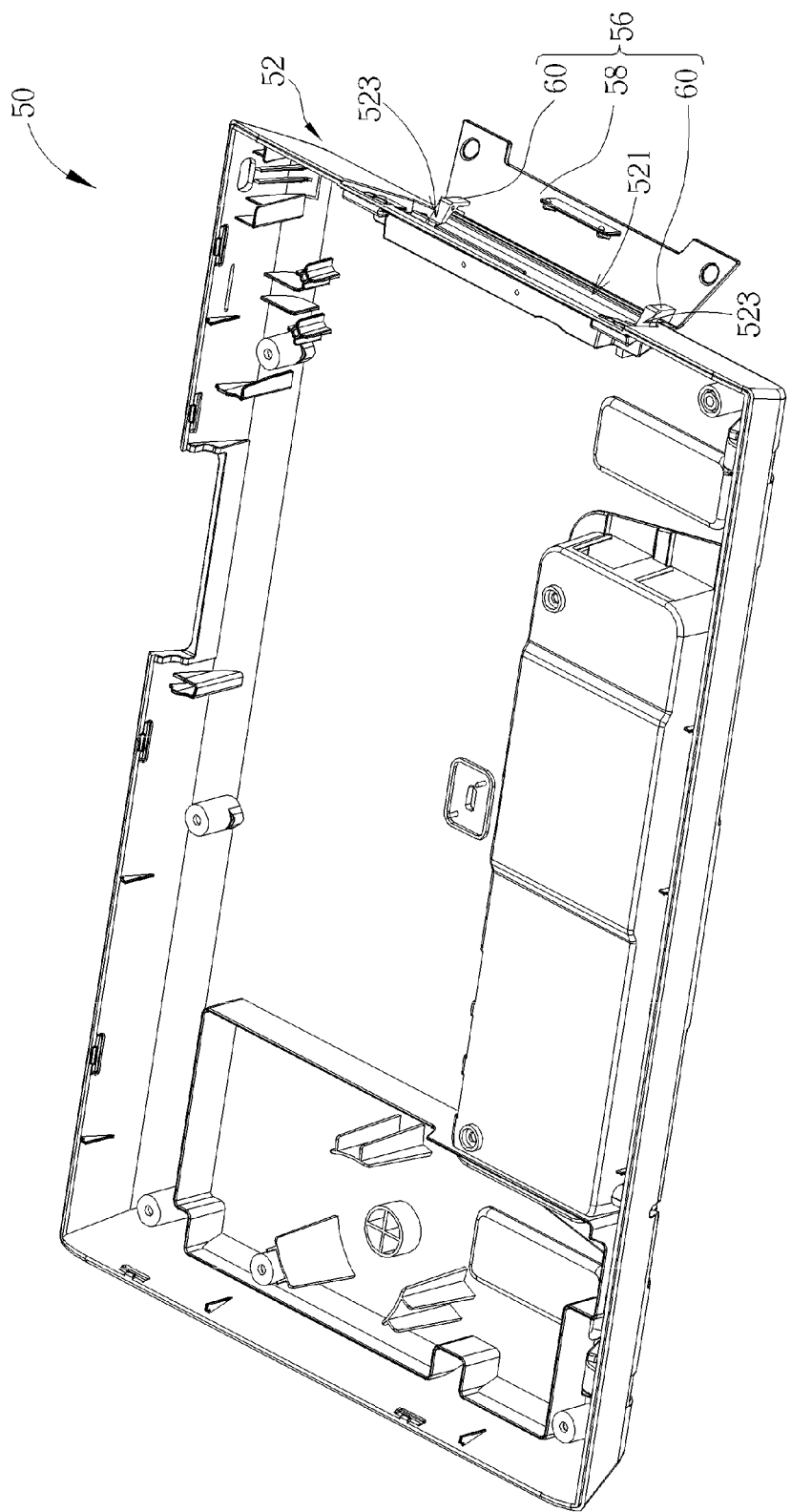
FIG. 1 and FIG. 2 respectively are a partial diagram and an exploded diagram of an electronic device according to a preferred embodiment of the present invention.
Figure 2:
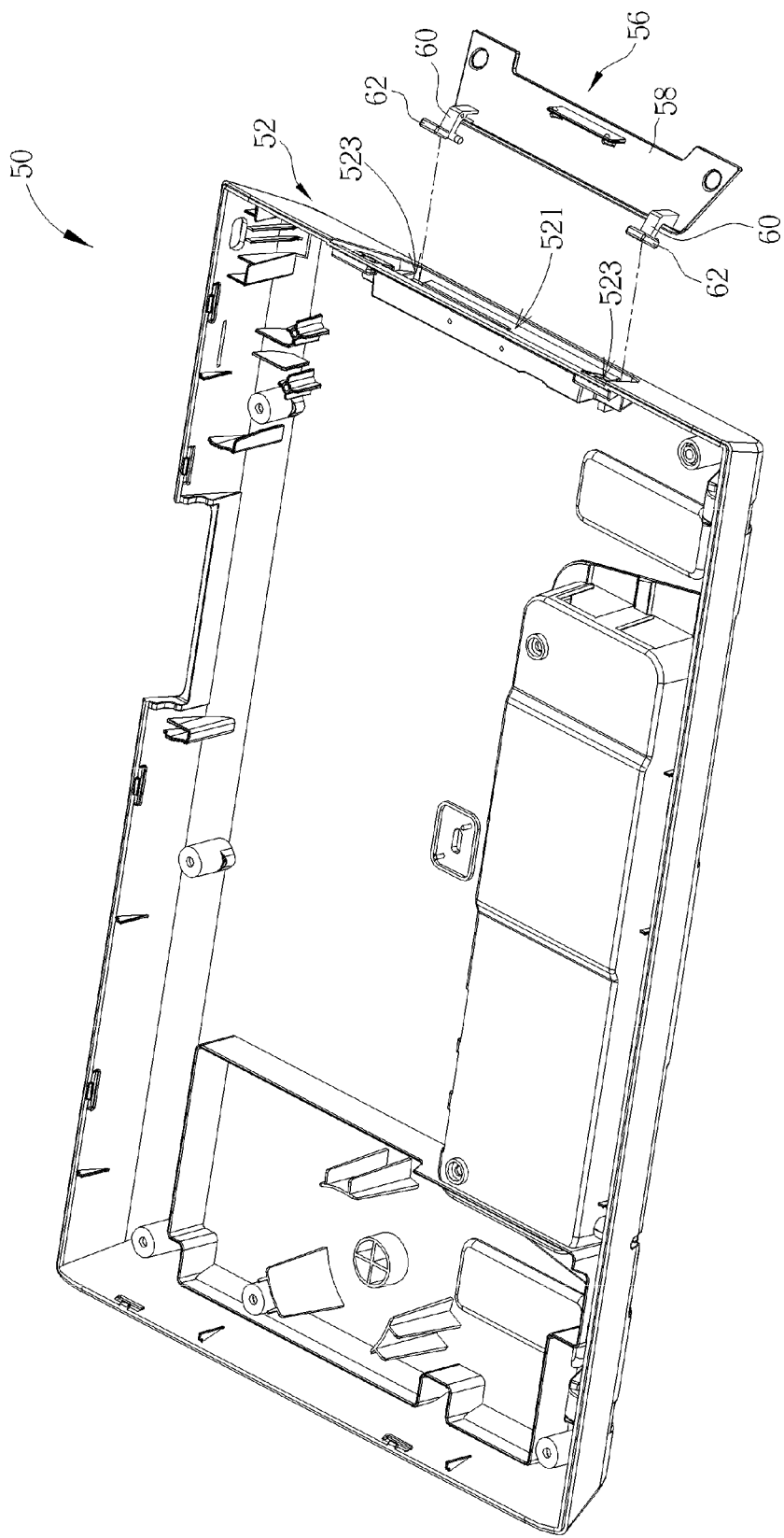
Figure 3:
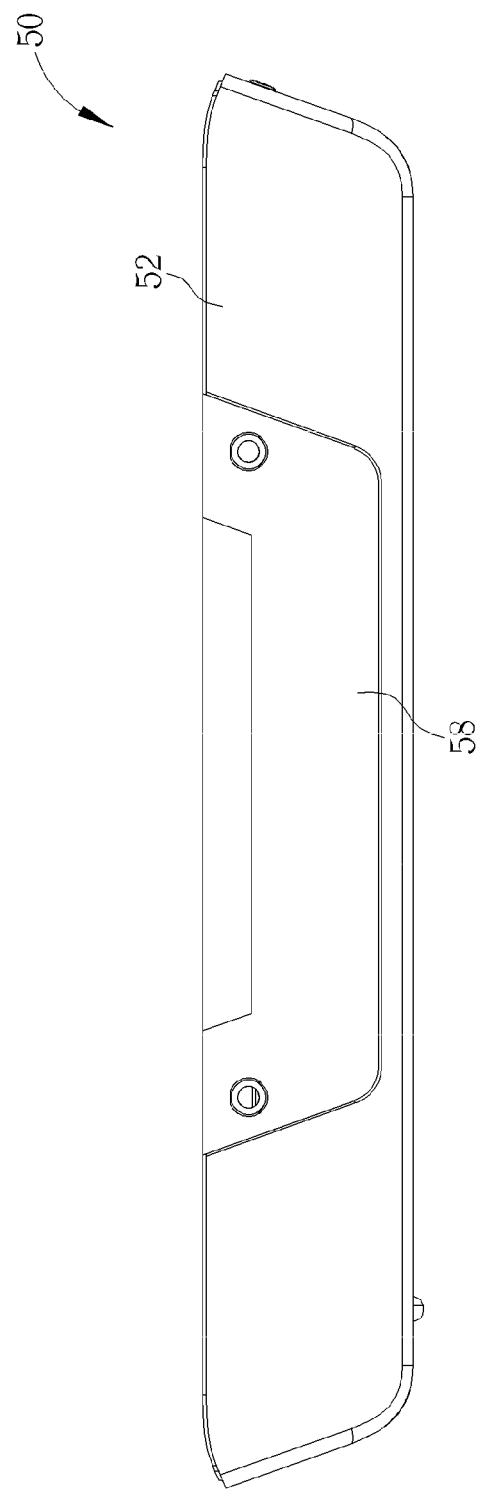
FIG. 3 and FIG. 4 respectively are lateral views of the electronic device in different modes according to the preferred embodiment of the present invention.
Figure 4:
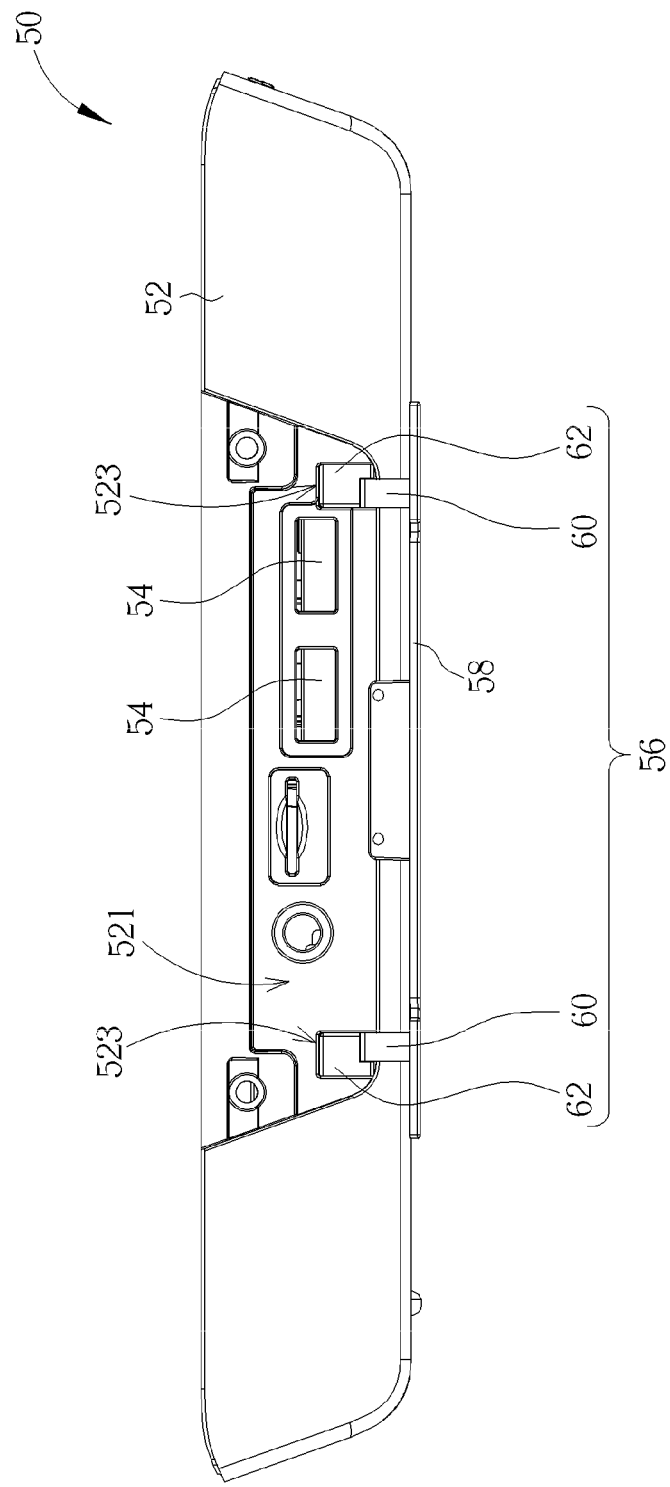

Please refer to FIG. 1 to FIG. 4. FIG. 1 and FIG. 2 respectively are a partial diagram and an exploded diagram of an electronic device 50 according to a preferred embodiment of the present invention. FIG. 3 and FIG. 4 respectively are lateral views of the electronic device 50 in different modes according to the preferred embodiment of the present invention. The electronic device 50 includes a housing 52 for covering an inner electronic component. A slot 521 and at least one pivoting hole 523 are formed on the housing 52. The electronic device 50 further includes at least one connector 54 installed inside the slot 521 on the housing 52. The electronic device 50 can utilize the connector 54 to connect an external expanding device. The electronic device 50 further includes a door structure 56 connected to the housing 52 for shielding the connector 54. The door structure 56 includes a rotary cover 58, at least one pivotal portion 60 and at least one shielding component 62. The rotary cover 58 is connected to the housing 52 in a rotatable manner. As shown in FIG. 3, the rotary cover 58 can cover the slot 521 and the connecter 54 disposed inside the slot 521 when the rotary cover 58 rotates to a closed position, so as to protect the connector 54 and to keep preferred aesthetic of the electronic device 50. As shown in FIG. 4, the rotary cover 58 can rotate to an opened position to expose the slot 521 and the connecter 54 disposed inside the slot 521, so that the connector 54 can be connected to the external expanding device.

Figure 5:
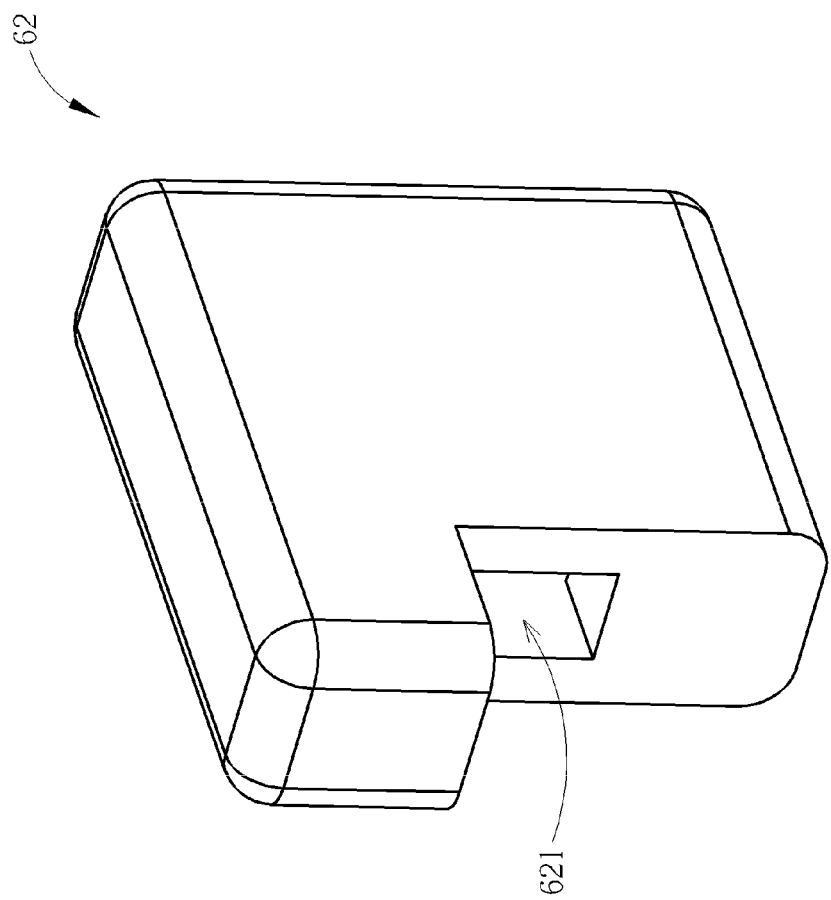
FIG. 5 is a diagram of a shielding component according to the preferred embodiment of the present invention.
Figure 6:
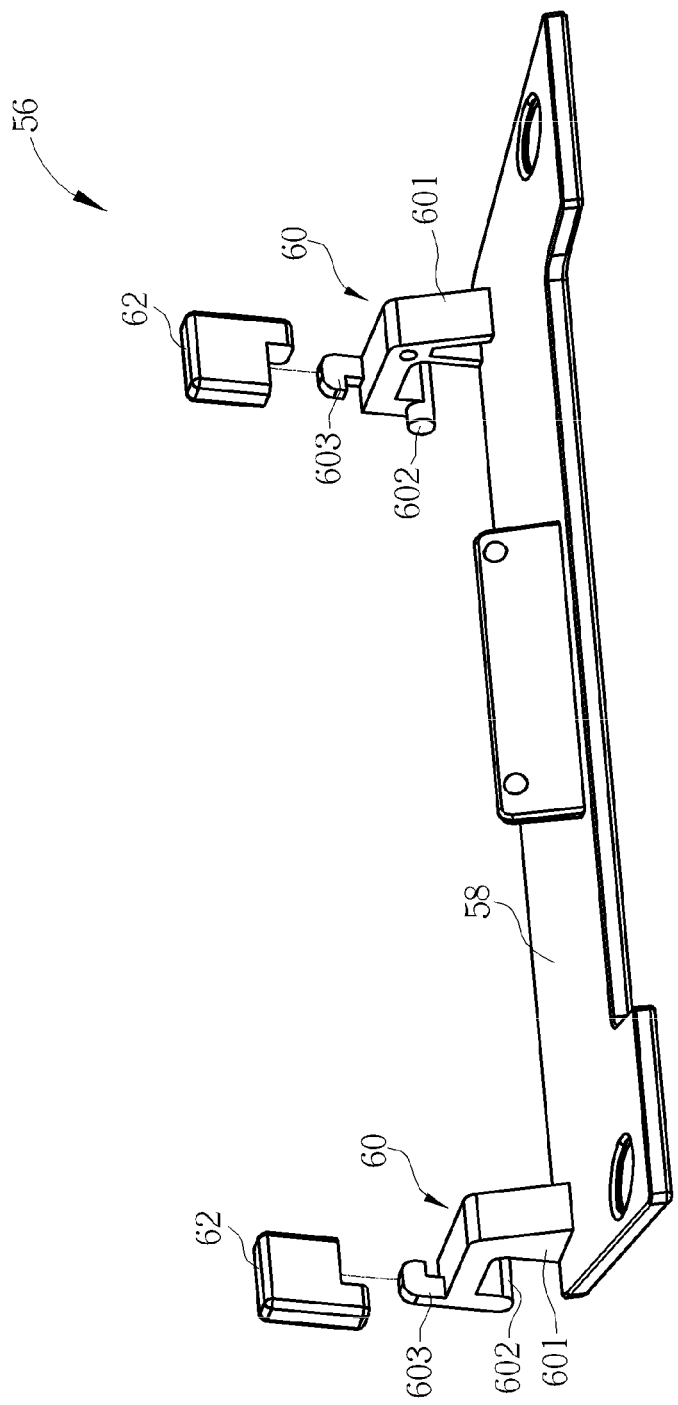
FIG. 6 is a diagram of the shielding component not installed on the pivotal portion 60 according to the preferred embodiment of the present invention.
Figure 7:
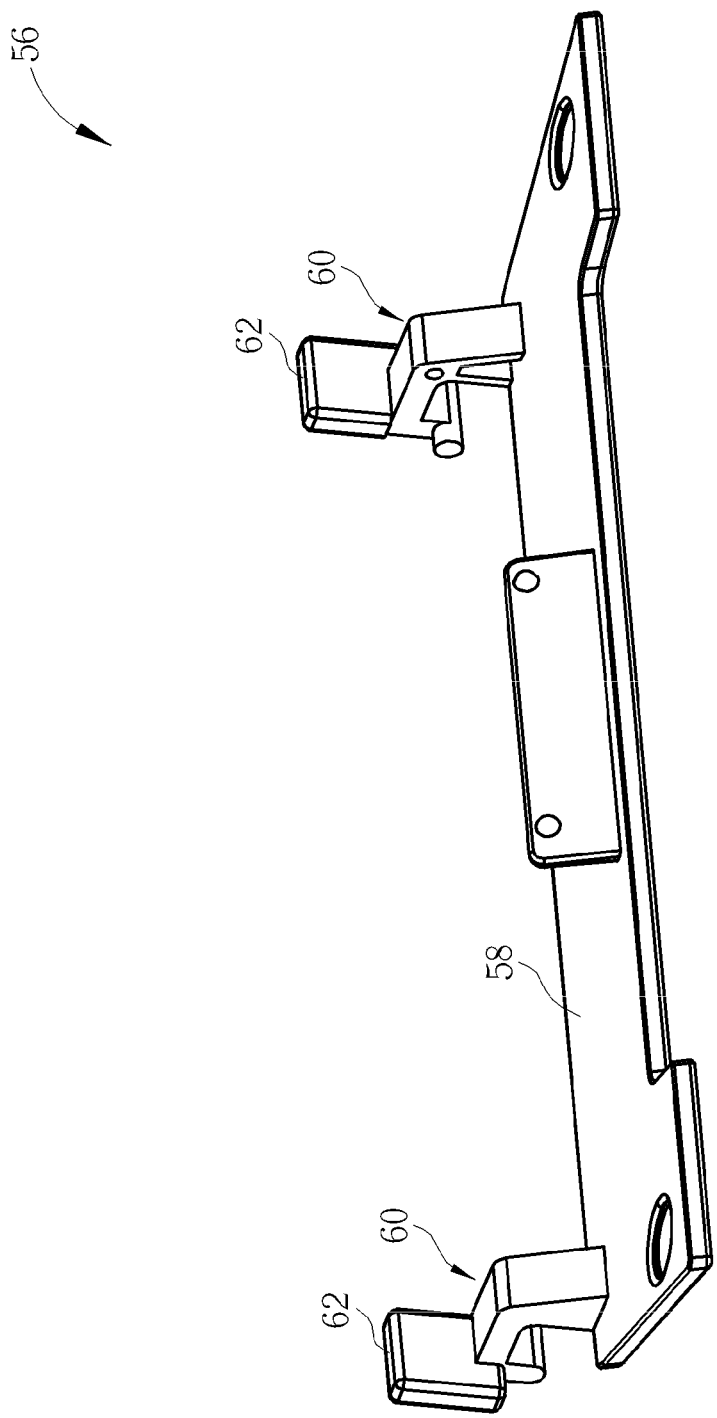
FIG. 7 and FIG. 8 respectively are a diagram and a sectional view of the shielding component installed on a pivotal portion according to the preferred embodiment of the present invention.
Figure 8:
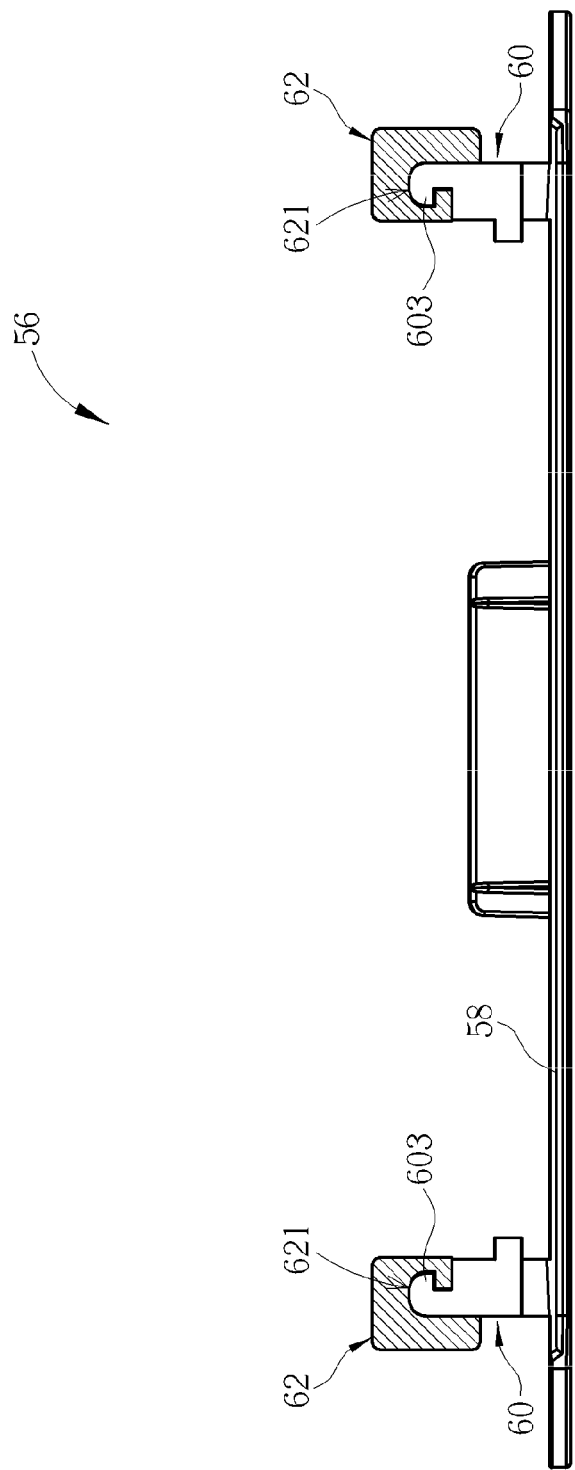

Please refer to FIG. 5 to FIG. 8. FIG. 5 is a diagram of the shielding component 62 according to the preferred embodiment of the present invention. FIG. 6 is a diagram of the shielding component 62 not installed on the pivotal portion 60 according to the preferred embodiment of the present invention. FIG. 7 and FIG. 8 respectively are a diagram and a sectional view of the shielding component 62 installed on the pivotal portion 60 according to the preferred embodiment of the present invention. In this embodiment, the door structure 56 includes two pivotal portions 60 installed on two sides of the rotary cover 58. Disposition and amounts of the pivotal portion 60 are not limited to the above-mentioned embodiment, and depend on actual design demand. The pivotal portion 60 includes a first part 601, a second part 602 and a third part 603. The first part 601 is connected to the rotary cover 58. The second part 602 passes through the pivoting hole 523 by a side of the slot 521 on the housing 52 and pivots to the housing 52, so that the rotary cover 58 can rotate relative to the housing 52. The third part 603 is disposed on a position adjacent to the second part 602. The third part 603 is located inside or adjacent to the pivoting hole 523 when the rotary cover 58 rotates relative to the housing 52, which means the third part 603 is not separated from the pivoting hole 523. The shielding component 62 is installed on the third part 603 of the pivotal portion 60. The shielding component 62 is located inside or adjacent to the pivoting hole 523 when the rotary cover 58 rotates relative to the housing 52, which means the shielding component 62 is not separated from the pivoting hole 523. In this embodiment, the door structure 56 includes two shielding components 62 respectively installed on the corresponding pivotal portions 60.

For an assembly of the door structure 56, the rotary cover 58 is disposed on the housing 52, which means the second part 602 of the pivotal portion 60 passes through the pivoting hole 523 on the housing 52 and pivots to the housing 52. Then, the shielding component 62 is disposed on the third part 603 of the pivotal portion 60 inside the housing 52. For stably fixing the shielding component 62 on the pivotal portion 60, a sunken slot 621 can be formed on the shielding component 62. The third part 603 of the pivotal portion 60 can be a hook for engaging inside the sunken slot 621 on the shielding component 62, so as to fix the shielding component 62 on the pivotal portion 60. The shielding component 62 can be made of soft material, such as rubber material. As the hook of the pivotal portion 60 is engaged inside the sunken slot 621 on the shielding component 62, the shielding component 62 can be resiliently deformed to smoothly engage the hook with the sunken slot 621 on the shielding component 62. The combination of the hook and the sunken slot 621 can effectively prevent the shielding component 62 and the pivotal portion 60 from separation. Combination of the shielding component 62 and the pivotal portion 60 is not limited to the above-mentioned embodiment, and depends on actual design demand.

Figure 9:
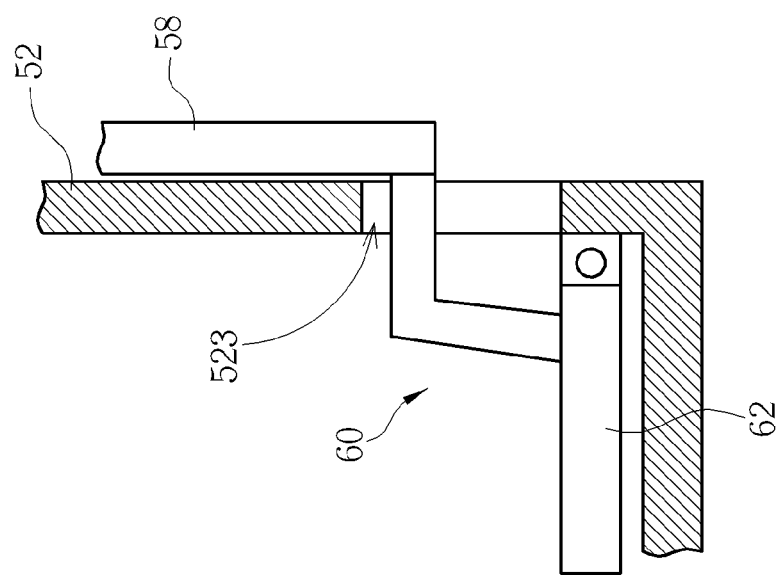
FIG. 9 and FIG. 10 respectively are diagrams of a pivoting hole not shielded and shielded by the shielding component according to the preferred embodiment of the present invention.
Figure 10:
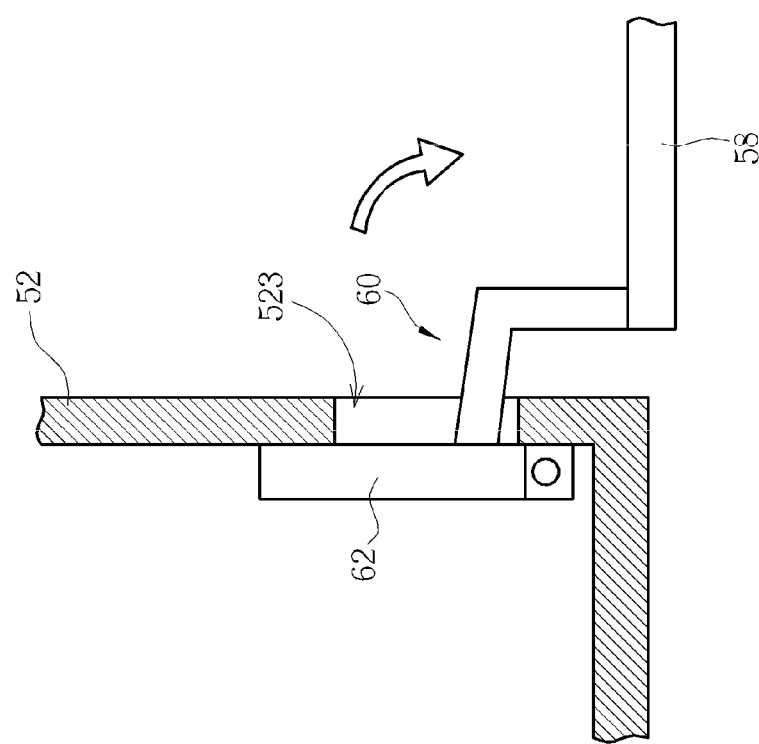

Please refer to FIG. 9 and FIG. 10. FIG. 9 and FIG. 10 respectively are diagrams of the pivoting hole 523 not shielded and shielded by the shielding component 62 according to the preferred embodiment of the present invention. It should be mentioned that the shielding component 62 connected to the pivotal portion 60 can rotate with the pivotal portion 60 to a position that the shielding component 62 contacts against the pivoting hole 523 on the housing 52 when the rotary cover 58 rotates from a position shown in FIG. 9 to the opened position shown in FIG. 10 to expose the slot 521 and the connecter 54 disposed by the side of the slot 521, so as to at least partly shield the pivoting hole 523 on the housing 52. Dimensions of the shielding component 62 can be substantially greater than or equal to dimensions of the pivoting hole 523. Therefore, the shielding component 62 can completely shield the pivoting hole 523 on the housing 52, so as to isolate inside and outside of the housing 52 and to effectively prevent dust and pollution from falling into the housing 52 via the pivoting hole 523.

Figure 11:
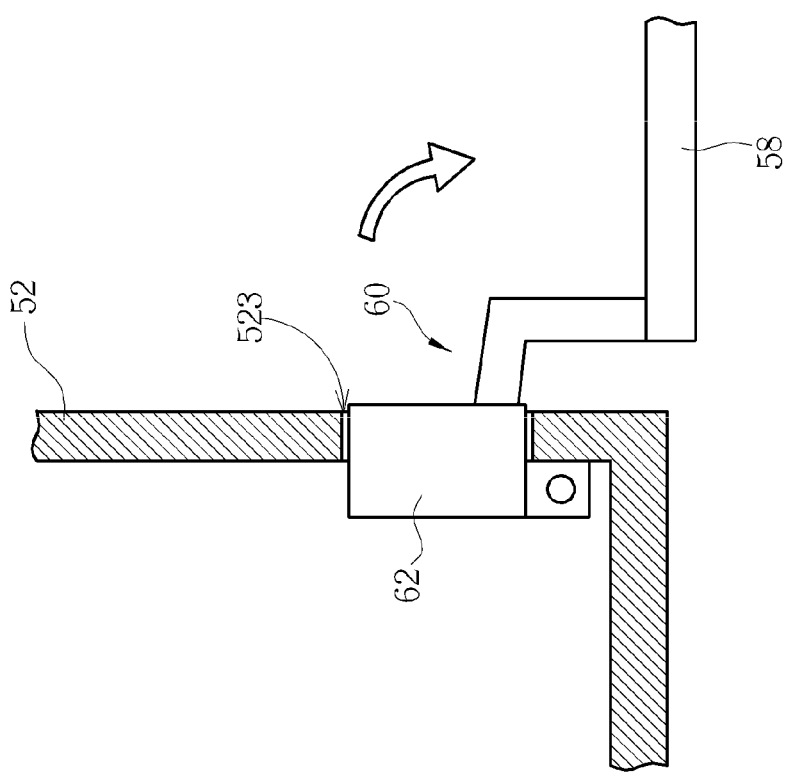
FIG. 11 and FIG. 12 respectively are diagrams of the pivoting hole shielded by the shielding component according to the preferred embodiment of the present invention.
Figure 12:
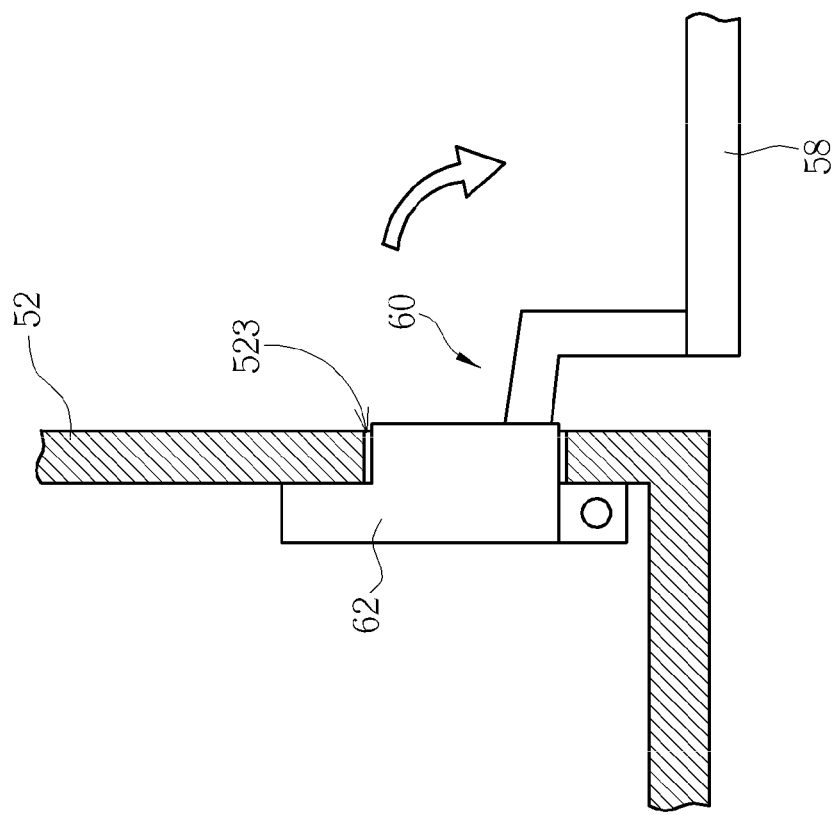

Please refer to FIG. 11 and FIG. 12. FIG. 11 and FIG. 12 respectively are diagrams of the pivoting hole 523 shielded by the shielding component 62 according to the preferred embodiment of the present invention. As shown in FIG. 11, the shielding component 62 can fit into the pivoting hole 523 (which means the dimensions of the shielding component 62 is substantially equal to or smaller than the dimensions of the pivoting hole 523) when the shielding component 62 pivots to a position corresponding to the pivoting hole 523 on the housing 52. Further, as shown in FIG. 12, a part of the shielding component 62 fits into the pivoting hole 523, and the other part of the shielding component 62 contacts against an inner side of the pivoting hole 523. However, the shielding component 62 further can be located at outside of the pivoting hole 523 and adjacent to the pivoting hole 523. Disposition of the shielding component 62 depends on actual design demand. Besides, the shielding component 62 can be made of nonconductive material, such as the rubber material. The shielding component 62 can be utilized to prevent electromagnetic interference (EMI) when completely shielding the pivoting hole 523 on the housing 52. Because the shielding component 62 shields the pivoting hole 523 on the housing 52, a path of electrostatic discharge (ESD) can be varied to provide discharge protection, which means static electricity can not be transmitted into the housing 52 via the pivoting hole 523. The shielding component 62 can be made of conductive material to provide ESD discharge path or to prevent EMI grounding effect.

Comparing to the prior art, the present invention provides the door structure capable of effectively shielding the pivoting hole on the housing as rotating to the opened position and the electronic device therewith. Because the pivotal portion connected to the rotary cover passes through the pivoting hole on the housing to directly pivot to the inner of the housing, the assembly and disassembly of the rotary cover is tooless and easy, so as to increase the assembly convenience and to decrease the assembly cost. Further, when the rotary cover is opened relative to the housing, the present invention utilizes the shielding component connected to the pivotal portion to completely shield the pivoting hole on the housing, to effectively prevent the dust from falling into the housing via the pivoting hole and to prevent effects of the electromagnetic interference and the electrostatic discharge.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A door structure comprising:
  a rotary cover connected to a housing in a rotatable manner, the rotary cover covering a slot on the housing as rotating to a closed position;
  a pivotal portion, the pivotal portion comprising:
    a first part connected to the rotary cover;
    a second part pivoting to a pivoting hole on a side of the slot on the housing, so that the rotary cover rotates relative to the housing; and
    a third part located inside or adjacent to the pivoting hole when the rotary cover rotates relative to the housing; and
  a shielding component detachably disposed on the third part, the shielding component moving with the third part to the pivoting hole or to a position adjacent to the pivoting hole when the rotary cover rotates to an opened position to expose the slot on the housing, so as to contact against the housing to at least partly shield the pivoting hole on the housing.

2. The door structure of claim 1, wherein dimensions of the shielding component are substantially greater than dimensions of the pivoting hole.

3. The door structure of claim 2, wherein the shielding component contacts against an inner side of the pivoting hole when the rotary cover rotates to the opened position.

4. The door structure of claim 2, wherein a part of the shielding component fits into the pivoting hole, and the other part of the shielding component contacts against an inner side of the pivoting hole when the rotary cover rotates to the opened position.

5. The door structure of claim 1, wherein dimensions of the shielding component are substantially equal to or smaller than dimensions of the pivoting hole.

6. The door structure of claim 5, wherein the shielding component fits into the pivoting hole when the rotary cover rotates to the opened position.

7. The door structure of claim 5, wherein the shielding component is located at outside of the pivoting hole and adjacent to the pivoting hole when the rotary cover rotates to the opened position.

8. The door structure of claim 1, wherein a sunken slot is formed on the shielding component, and the third part of the pivotal portion is a hook for engaging with the sunken slot so as to fix the shielding component on the pivotal portion.

9. The door structure of claim 1, wherein the shielding component is made of nonconductive material.

10. The door structure of claim 9, wherein the shielding component is made of rubber material.

11. An electronic device comprising:
  a housing whereon a slot and a pivoting hole are formed;
  at least one connector installed on a side of the slot on the housing; and
  a door structure connected to the housing for shielding the at least one connector, the door structure comprising:
    a rotary cover connected to the housing in a rotatable manner, the rotary cover covering the at least one connector as rotating to a closed position;
    a pivotal portion, the pivotal portion comprising:
      a first part connected to the rotary cover;
      a second part pivoting to the pivoting hole on a side of the slot on the housing, so that the rotary cover rotates relative to the housing; and
      a third part located inside or adjacent to the pivoting hole when the rotary cover rotates relative to the housing; and
    a shielding component detachably disposed on the third part, the shielding component moving with the third part to the pivoting hole or to a position adjacent to the pivoting hole when the rotary cover rotates to an opened position to expose the slot on the housing, so as to contact against the housing to at least partly shield the pivoting hole on the housing.

12. The electronic device of claim 11, wherein dimensions of the shielding component are substantially greater than dimensions of the pivoting hole.

13. The electronic device of claim 12, wherein the shielding component contacts against an inner side of the pivoting hole when the rotary cover rotates to the opened position.

14. The electronic device of claim 12, wherein a part of the shielding component fits into the pivoting hole, and the other part of the shielding component contacts against an inner side of the pivoting hole when the rotary cover rotates to the opened position.

15. The electronic device of claim 11, wherein dimensions of the shielding component are substantially equal to or smaller than dimensions of the pivoting hole.

16. The electronic device of claim 15, wherein the shielding component fits into the pivoting hole when the rotary cover rotates to the opened position.

17. The electronic device of claim 15, wherein the shielding component is located at outside of the pivoting hole and adjacent to the pivoting hole when the rotary cover rotates to the opened position.

18. The electronic device of claim 11, wherein a sunken slot is formed on the shielding component, and the third part of the pivotal portion is a hook for engaging with the sunken slot so as to fix the shielding component on the pivotal portion.

19. The electronic device of claim 11, wherein the shielding component is made of nonconductive material.

20. The electronic device of claim 19, wherein the shielding component is made of rubber material.

\* \* \* \* \*